United States Patent [19]

Niedzwiecke et al.

[11] 4,018,491
[45] Apr. 19, 1977

[54] CARRIER FOR DEVICES

[75] Inventors: Andrew J. Niedzwiecke, Perris; Joseph M. Shaheen, La Habra, both of Calif.

[73] Assignee: Rockwell International Corporation, El Segundo, Calif.

[22] Filed: Mar. 8, 1976

[21] Appl. No.: 665,141

[52] U.S. Cl. .................................. 339/4; 29/626; 339/17 CF; 339/75 MP; 339/176 MF
[51] Int. Cl.[2] ...................................... H01R 39/00
[58] Field of Search ................. 339/4, 17 R, 17 CF, 339/17 L, 17 LM, 17 M, 18 R, 75 MP, 176 MF, 176 MP, 174; 29/626

[56] References Cited
UNITED STATES PATENTS

| | | | |
|---|---|---|---|
| 3,771,109 | 11/1973 | Bruckner et al. | 339/174 |
| 3,823,350 | 7/1974 | Stoner | 339/174 X |
| 3,855,693 | 12/1974 | Umbaugh | 29/626 |
| 3,953,101 | 4/1976 | Palecek | 339/17 CF X |

Primary Examiner—Roy Lake
Assistant Examiner—DeWalden W. Jones
Attorney, Agent, or Firm—H. Fredrick Hamann; G. Donald Weber, Jr.; Roland G. Rubalcava

[57] ABSTRACT

A carrier for making electrical connection with a microelectronic device without bonding the device to the carrier is disclosed. The carrier is designed to accommodate a device such as, but not limited to, a magnetic bubble domain memory chip. The circuit board and keeper board are joined by a hinge having tension means to readily permit opening and locking of the carrier. When the carrier is in the open position, a device is positioned in the carrier. By locking the carrier, the device is secured and the required electrical connection is made between the carrier and the device. The carrier can now be connected to a test fixture for evaluating the electrical characteristics of the chip without bonding any leads or the carrier may be utilized in a system as an integral part of that system.

10 Claims, 2 Drawing Figures

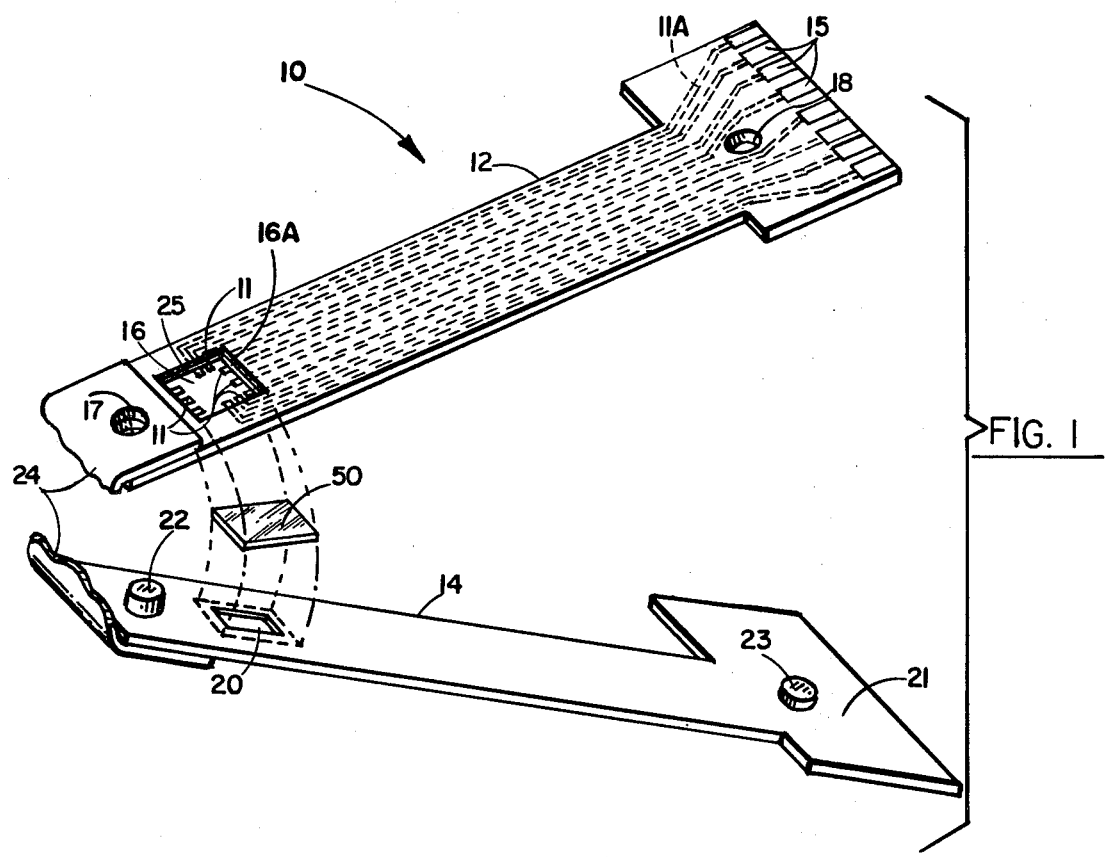
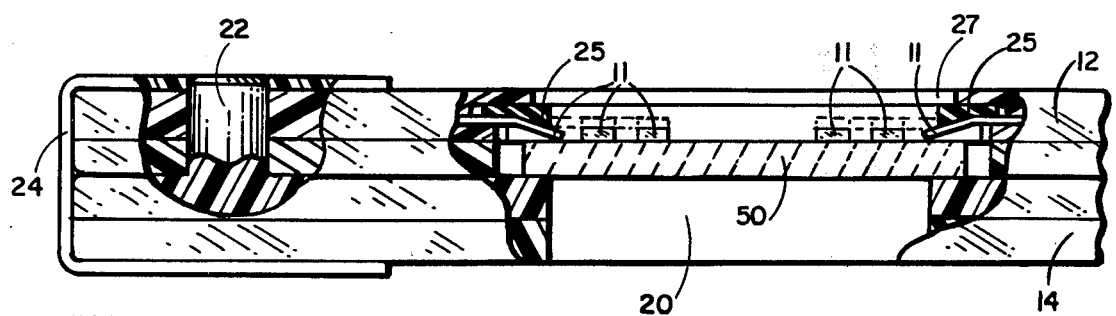
FIG. 1
FIG. 2

CARRIER FOR DEVICES

BACKGROUND OF THE INVENTION

1. Field of the Invention

This invention relates to an apparatus for carrying and making electrical connections to devices, such as bubble domain memory devices, without any permanent bonding between the apparatus and the device.

2. Description of Prior Art

Many microelectronic, solid state devices are being developed and fabricated. These tiny devices require extensive testing during various stages of the design, development and fabrication. Presently, some devices are tested when directly bonded to a carrier with a suitable adhesive. Interconnection between the device and the carrier is achieved with wire leads which are thermocompression bonded to the device and the carrier. The carrier is then inserted into the test fixture for evaluating the device. This technique is suggested by U.S. Pat. No. 3,855,693, entitled "Method For Assembling Microelectronic Apparatus" by C. W. Umbaugh.

After evaluation of the device, the carrier is removed from the test fixture and the wire bonds on the device and the carrier are broken. In addition, the device is unbonded from the carrier. This technique subjects the devices, which are small and fragile, to excessive handling, thereby increasing the risk of damage to the device.

Another known art technique, the beam lead chip carrier, is disclosed in U.S. Pat. No. 3,823,350, entitled "Protective Carrier for Semiconductor Chips" by C. L. Stoner. This carrier includes a support base which has electrically conductive paths therein and a cavity therethrough. The conductive paths extend adjacent the cavity and are arranged to correspond with beam leads of devices to be carried and tested. A cover having locking tabs and aligning pins snaps onto the carrier substrate. The cover has a chamber in its underside to accommodate a device. The walls of the cover contact the beam leads of the device whereby the beam leads are, in turn, compressed into contact with the conductive path of the support base.

This technique is an improvement over the art that requires adhesive for bonding the devices to the carrier and metallurgical bonding of wire leads between the claims and the device. Nevertheless, the locking and aligning means for securing the chip in electrical contact with the conductive path is complex. Consequently, this type of carrier is not believed to be economically feasible because of the extensive loading and handling time required in placing the chip in the carrier.

SUMMARY OF THE INVENTION

This invention relates to a carrier that can make electrical contact with a non beam leaded microelectronic device without bonding the device to the carrier. The instant invention comprises a beam leaded interconnection board having a cavity and a keeper board. The interconnection board and the keeper board are joined together at one end by a hinge. One of the boards includes at least one aligning (and locking) pin which mates with an aperture in the other board. The interconnection board includes a compressed resilient spring which is inlaid on the beam leads by lamination, thereby securing the spring in position for compressing the beam leads into contact with the device. To load the chip into the carrier, the boards are unlocked to the open position. The chip is positioned in the interconnection board cavity. The keeper board is then closed by engaging aligning pins in the interconnection board. The closing of the test fixture simultaneously brings the beam leads on the interconnection board into electrical contact with the device. The carrier can now be connected to a test fixture for evaluating the electrical characteristics of the device. To remove the device, the carrier is unlocked and the device may be removed without damage. Conversely, once the device is tested, the carrier may be shipped and installed in a system, for example, to function as a memory.

BRIEF DESCRIPTION OF THE DRAWINGS

FIG. 1 is an exploded view of a preferred embodiment of a device carrier which represents this invention including the arrangement of spring means and a device therein.

FIG. 2 depicts a cross-section of beam leads on the carrier in abutment with the supported device in accordance with the instant invention.

DETAILED DESCRIPTION

Referring to FIG. 1, there is illustrated a carrier 10 which includes an interconnection circuit board 12 and a keeper board 14. In accordance with one embodiment, circuit board 12 has a T-shaped configuration having a cutout rectangular section 16. Cavity 16 and circuit board 12, of course, may take any desired configuration. In one embodiment, the dimensions of cavity 16 step down to smaller dimensions to form a lip or shoulder 16A therearound such that the device 50 seats in cavity 16 and protrudes slightly over the surface of circuit board 12. Circuit board 12 includes aligning apertures 18 located at the T-end and aperture 17 at the cavity end of circuit board 12. Circuit board 12 may be constructed of any suitable material sucah as epoxy-glass. In one embodiment, circuit board 12 is fabricated of a laminated construction similar to the method taught in copending application entitled "Method of Fabricating a Beam Lead Flexible Circuit" by Joseph Shaheen et al., filed December of 1975, and assigned to common assignee. The beam leads 11 and conductors 11A on circuit board 12 are formed from beryllium copper foil to obtain the advantage of a greater modulus of elasticity which permits the beam leads 11 to recover more readily after deflection. Other suitable materials, such as copper, may also be utilized for beam leads.

The conductors 11A of the instant invention flare out at the T end to form a connector end 15 that can be inserted into test apparatus for device evaluation. Conductors 11A extend slightly over cavity 16 to form beam leads 11. When a device 50 is positioned in cavity 16, beam leads 11 are in position for making electrical contact with the electrical contacts on the device. The contacts on the device may take the form of contact pads, contact bumps or other suitable leads.

Keeper board 14 has substantially the same configuration as circuit board 12. Keeper board 14 may include conductors and beam leads (not shown) as well as cavity 20. In the embodiment shown, keeper board 14 includes cavity 20 which is aligned with cavity 16. Keeper board 14 also includes aligning pins 22 and 23 which are aligned with apertures 17 and 18, respectively. Aligning pin 22 is adjacent cavity 20 and pin 23 is adjacent the T end 21. Typically, cavity 20 (if used)

is smaller than cavity 16 to retain device 50 in cavity 16. While cavity 20 is not required in all applications, the cavity provides a see-through capability for visual circuit alignment.

Circuit board 12 and keeper board 14 are connected at the cavity ends as shown in FIG. 1 by hinge 24. In one embodiment, hinge 24 is formed from a polyimide film .002" thick coated with an adhesive and joined to the corresponding ends of boards 12 and 14. However, since hinge 24 is relatively thin and flexible, it permits circuit board 12 and keeper board 14 to engage by merely urging one board towards the other until they are superimposed and locked by the insertion of aligning pins 22 and 23, respectively in apertures 17 and 18. Likewise, hinge 24 permits both boards to open away from each other. In the open position, device 50, also shown in FIG. 1, may be positioned in cavity 16 and the device may now be secured and placed in electrical contact with circuit board 12 by bringing keeper board 14 into closed contact with circuit board 12. That is, the boards 12 and 14 are pressed into position by inserting pins 22 and 23 into apertures 17 and 18.

FIG. 1 also shows spring 25 which may be rubber or other suitable material and which is inlaid over beam leads 11 and covered with a layer of epoxy glass. Spring 25, as shown, has a configuration suited to fit around cavity 16. The spring is disposed between beam leads 11 and at least one layer of board 12 in order to impose a variable force on the beam leads. That is, spring 25 tends to force beam leads 11 inwardly relative to cavity 16 but permits the beam leads to bend upwardly if device 50 so dictates.

Referring to FIG. 2, there is shown, partially in section, a side view of the instant invention. In the locked position, beam leads 11 are shown extending over the device 50. Beam leads 11 are actually compressed into electrical contact with the contacts of device 50 when the carrier is in the closed position. The electrical contact is assured by the tension of the two locked boards which are aligned to one another and by the compression of rubber spring 25 which is sandwiched between an epoxy glass layer 27 of board 12 and beam leads 11.

In one embodiment, spring 25 is inserted between beam lead 11 and the epoxy glass cover layer 27 of board 12. A cover layer of epoxy glass 27 is laminated to secure the rubber spring 25 between beam leads 11 and the glass layer 27. In one embodiment, rubber spring 25 is formed from slicone rubber, polyurethane casting and a teflon film. Spring 25 may take whatever configuration is desirable to compress the beam leads. For example, it may not be necessary to be formed completely around cavity 16. Spring 25, in one embodiment, may be formed from clear material for the purpose of visually seeing and aligning the beam leads.

The tension effect is assured by the locking effect of the T ends when carrier 10 is inserted into a testing device. Pins 22 adjacent the cavity end and aligning pin 23 at the connector end serve as alignment pins and also contribute to the tension effect. The device 50 seats in cavity 16 and protrudes slightly over the surface of circuit board 12. This tension effect on device 50 comes from locking the boards together and compressing rubber spring 25. The tension effect is sufficient to assure that the device is secured and the electrical contact is maintained with beam leads 11 and the device contacts by way of rubber spring 25 compressing downward on beam leads 11 as shown in FIG. 2. However, the tension effect is not enough to harm the device.

While carrier 10 is in the locked position, continuity of the device may readily be determined by connecting a continuity tester to the exposed connector ends 15 of circuit board 12. Once continuity is established, the device is ready to be tested at individual device level, as for example, by insertion into magnetic fields (for bubble domain devices, with test results obtained at connector end 15. After the device characteristics have been determined, the device is readily removed by merely unlocking the boards and removing the device without harming the device. In the alternative, once the device is found to be suitable, the carrier may be shipped, as is, and installed in a system thereby to be utilized as an integrated part of that system.

Hence, there is shown and described a simple apparatus for carrying and testing microelectronic devices. The instant invention reduces the handling of devices, permits testing of the device without bonding to the carrier. The result is increased yield in testing and shipping which results in lowering the costs of producing the devices.

Thus, it will be appreciated by those skilled in the art, that the invention may be carried out in various ways and may take various forms and embodiments other than the illustrated embodiment heretofore described. For example, the carrier may have a unitary configuration. That is, the hinge may be an integral portion of the pair of boards rather than a separate member. Also, pins 22 and 23 may be arranged to provide alignment only and a separate keeper clip (not shown) may be used to hold the carrier in the closed condition. Also, electrical conductors may be formed on both boards and even on the hinge portion, if desirable. Furthermore, it should be understood that multiple devices can be tested in carriers of appropriate design.

We claim:
1. An apparatus for supporting a device comprising:
   a first board having at least one cavity for accommodating said device;
   at least one electrical conductor disposed on said first board and extending over said cavity to form beam lead interconnections;
   resilient means formed to fit around the inner surface of said cavity for applying force to said beam lead interconnections;
   a second board;
   hinge means joining said first and second boards; and
   locking means for said boards.
2. The apparatus recited in claim 1 wherein said first board and said second board have substantially similar configurations.
3. An apparatus as recited in claim 1 including a plurality of electrical conductors on said first board which flare out to form a connector end for inserting into test apparatus.
4. An apparatus as recited in claim 1 wherein said resilient means is formed from rubber material and is laminated between a top layer of said first board and said beam lead interconnectors.
5. An apparatus as recited in claim 1 wherein said hinge is formed from a separate polyimide film and is connected opposite the connector at the end of said boards.
6. An apparatus as recited in claim 1 wherein said locking means of said boards includes a first pin adjacent said cavity and a second pin located adjacent the connector end of said second board, both pins of said second board fitting in corresponding apertures in said first board.

7. An apparatus as recited in claim 1 wherein electrical contact is made when said boards are locked and said resilient means compresses said beam leads in contact with said device.

8. An apparatus as recited in claim 1 including said device wherein said apparatus is installed in a system to function as an integral part of that system.

9. An apparatus as recited in claim 1 wherein said beam lead interconnectors are formed from beryllium copper.

10. An apparatus for testing and carrying non-beam leaded devices comprising:

a first board having at least one cavity for accommodating said device and at least one electrical conductor disposed on said first board and extending over said cavity to form beam lead interconnectors;

resilient means formed on the inner surface of said cavity said resilient means inlaid over said beam leads and covered by an epoxy layer for compressing said beam lead interconnections;

a second board having at least one cavity;

connecting means for said first and second boards;

aligning means for said first and second boards;

tension means on said first board for placing said beam lead interconnects in electrical contact with the leads of said device; and locking means for maintaining electrical contact with said beam leads interconnection and the leads of said device.

* * * * *